(12) United States Patent
Klenner

(10) Patent No.: US 11,637,736 B2
(45) Date of Patent: *Apr. 25, 2023

(54) TRANSMITTER, RECEIVER, TRANSMISSION METHOD, AND RECEPTION METHOD

(71) Applicant: Panasonic Intellectual Property Corporation of America, Torrance, CA (US)

(72) Inventor: Peter Klenner, Frankfurt (DE)

(73) Assignee: PANASONIC INTELLECTUAL PROPERTY CORPORATION OF AMERICA, Torrance, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/873,478

(22) Filed: Jul. 26, 2022

(65) Prior Publication Data

US 2022/0368585 A1 Nov. 17, 2022

Related U.S. Application Data

(63) Continuation of application No. 17/119,065, filed on Dec. 11, 2020, now Pat. No. 11,431,545, which is a
(Continued)

(30) Foreign Application Priority Data

Oct. 29, 2018 (JP) .............................. JP2018-202800

(51) Int. Cl.
*H04W 4/00* (2018.01)
*H04L 27/36* (2006.01)
(Continued)

(52) U.S. Cl.
CPC ........ *H04L 27/364* (2013.01); *H03M 13/255* (2013.01); *H04L 1/0042* (2013.01);
(Continued)

(58) Field of Classification Search
CPC ... H04L 27/364; H04L 1/0042; H04L 1/0071; H04L 27/366; H04L 27/3809; H04L 27/389; H03M 13/255
(Continued)

(56) References Cited

U.S. PATENT DOCUMENTS 9,276,654 B2 3/2016 Park
9,407,398 B2 8/2016 Batshon
(Continued)

FOREIGN PATENT DOCUMENTS

EP    3 334 075    6/2018
JP    H08-149055   6/1996
(Continued)

OTHER PUBLICATIONS

ETSI EN 302 755, "Digital Video Broadcasting (DVB); Frame structure channel coding and modulation for a second generation digital terrestiial television broadcasting system (DVB-T2)", V1.4.1 Feb. 2015.
(Continued)

*Primary Examiner* — Chuong T Ho
(74) *Attorney, Agent, or Firm* — Wenderoth, Lind & Ponack, L.L.P.

(57) ABSTRACT

A transmitter includes: a modulation circuit that modulates a data sequence using QAM by mapping the data sequence to only four symbols each of which differs in phase by 90 degrees from an adjacent one of the four symbols and at least two of which have different amplitudes; and a transmission circuit that wirelessly transmits the data sequence mapped to the four symbols through the modulation by the modulation circuit, by assigning the data sequence mapped to the four symbols through the modulation by the modulation circuit to different subcarriers for Orthogonal Frequency Division Multiplexing (OFDM).

6 Claims, 18 Drawing Sheets

Related U.S. Application Data continuation of application No. 16/209,504, filed on Dec. 4, 2018, now Pat. No. 10,897,388.

(60) Provisional application No. 62/596,439, filed on Dec. 8, 2017.

(51) Int. Cl.
    *H04L 27/38*     (2006.01)
    *H03M 13/25*     (2006.01)
    *H04L 1/00*     (2006.01)

(52) U.S. Cl.
    CPC .......... *H04L 1/0071* (2013.01); *H04L 27/366* (2013.01); *H04L 27/3809* (2013.01); *H04L 27/389* (2013.01)

(58) Field of Classification Search
    USPC ............................................. 370/329.33, 328
    See application file for complete search history.

(56) References Cited

U.S. PATENT DOCUMENTS

| | | | |
|---|---|---|---|
| 9,571,326 | B2 | 2/2017 | Bench |
| 9,634,878 | B1* | 4/2017 | Bench .................. F17D 5/00 |
| 10,027,526 | B2 | 7/2018 | Bench |
| 10,069,667 | B1 | 9/2018 | Bench |
| 10,897,388 | B2* | 1/2021 | Klenner .............. H03M 13/255 |
| 11,431,545 | B2* | 8/2022 | Klenner ................ H04L 27/389 |
| 2004/0120422 | A1 | 6/2004 | Lin |
| 2004/0252791 | A1 | 12/2004 | Shen |
| 2004/0255231 | A1 | 12/2004 | Shen |
| 2010/0225752 | A1* | 9/2010 | Bench ................ H04L 27/3455 375/261 |
| 2014/0270012 | A1 | 9/2014 | Sagi |
| 2015/0010104 | A1 | 1/2015 | Park |
| 2015/0071312 | A1 | 3/2015 | Batshon |
| 2015/0358194 | A1 | 12/2015 | Yu |
| 2016/0204902 | A1 | 7/2016 | Oveis Gharan et al. |
| 2016/0212616 | A1 | 7/2016 | Allen |
| 2017/0237598 | A1 | 8/2017 | Bench |
| 2018/0063819 | A1 | 3/2018 | Saito et al. |
| 2018/0219708 | A1 | 8/2018 | Kimura et al. |
| 2019/0052482 | A1 | 2/2019 | Yang |
| 2019/0052486 | A1 | 2/2019 | Kuchi |
| 2020/0106652 | A1 | 4/2020 | Kimura et al. |

FOREIGN PATENT DOCUMENTS

| | | |
|---|---|---|
| JP | 2010-041075 | 2/2010 |
| WO | 2009/148278 | 12/2009 |
| WO | 2016/158537 | 10/2016 |
| WO | 2017/051583 | 3/2017 |

OTHER PUBLICATIONS

P. P. Bergmans et al., "Cooperative Broadcasting", IEEE Trans. Inf. Theory, vol. IT-20, No. 3, May 1974, p. 317-324.

S. I. Park et al., "Low Complexity Layered Division Multiplexing for ATSC 3.0", IEEE Transactions on Broadcasting, vol. 62, No. 1, Mar. 2016, p. 233-243.

E. Stare et al., "WIB: A New System Concept for Digital Terrestrial Television (DTT)", IBC Conference Sep. 2016.

DVB-TM-WiB Study Mission Input Document TM-WIB0088, "Suggested approach forward for optimized interference cancellation processing", Nov. 16, 2017.

ATSC Standard: Physical Layer Protocol, Advanced Television Systems Committee, Doc. A/322:2017, Jun. 6, 2017.

Texas Instruments, 3GPP TSG RAN WG1#49bis R1-073162[online], CCFI Sequences in E-UTRA DL, uploaded on Jul. 2, 2007, internet<URL:https://www.3gpp.org/ftp/tsg_ran/WG1_RL1/TSGR1_49b/Docs/R1-073162.zip>, 5 pages.

Masataka IMAO et al., A Basic Study in Spectral Efficiency Improvement for OFDM System Using Constellation Coding, IEICE Technical Report, Nov. 2010, vol. 110, No. 268, pp. 93-96, with Full translation.

Ba-Zhong Shen et al., Low-Density Parity-Check Coded Modulation Using Multiple Signal Maps And Symbol Decoding, 2004 IEEE International Conference on Communications, 2004, pp. 420-424.

* cited by examiner

TRANSMITTER, RECEIVER, TRANSMISSION METHOD, AND RECEPTION METHOD

CROSS REFERENCE TO RELATED APPLICATION

This application is a continuation of U.S. application Ser. No. 17/119,065, filed Dec. 11, 2020, which is a continuation of U.S. application Ser. No. 16/209,504, filed Dec. 4, 2018, which claims the benefits of priorities of U.S. Patent Application No. 62/596,439 filed on Dec. 8, 2017 and Japanese Patent Application Number 2018-202800 filed on Oct. 29, 2018, the entire contents of which are hereby incorporated by reference.

BACKGROUND

1. Technical Field

The present disclosure relates to a transmitter, a receiver, a transmission method, and a reception method.

2. Description of the Related Art

Multiplexing multiple signals into a compound signal is a common method in data communications to share a single medium. Traditionally, data carrying different services is multiplexed in time or frequency. It is also shown that actually the superposition of different services increases the capacity over either TDM or FDM (see, for example, Non Patent Literature (NPL) 1: ETSI EN 302 755, "Digital Video Broadcasting (DVB); Frame structure channel coding and modulation for a second generation digital terrestrial television broadcasting system (DVB-T2)", v1.4.1, Feb. 2015; NPL 2: P. P. Bergmans and T. M. Cover, "Cooperative broadcasting," IEEE Trans. Inf. Theory, vol. 20, no. 3, pp. 317-324, May 1974; and NPL 3: S. I. Park, et. al. "Low Complexity Layered Division for ATSC 3.0," IEEE Transactions on Broadcasting, vol. 62, no. 1, pp. 233-243, March 2016).

Superposition modulation also is a core element of a recently proposed novel terrestrial broadcast system, called WiB, short for Wideband transmission with reuse factor 1 (NPL 4: E. Stare, J. J. Giménez, P. Klenner, "WIB: a new system concept for digital terrestrial television (DTT)", IBC Conference 2016). In WiB, neighboring transmitters are transmitting individual services. Regarding WiB, it was conjectured in NPL 5: DVB-TM-WiB Study Mission Input Document TM-WIB0088 "Suggested approach forward for optimized interference cancellation processing" that a power splitting approach may be beneficial in a broadcasting environment. In NPL 5, rather than using a uniform power distribution from each transmitter across the available bandwidth a non-uniform power distribution is suggested for receiver implementations to operate close to capacity.

SUMMARY

However, in NPL 5, the argument was made with idealized Gaussian signals. Thus, there is room for improvement when the power splitting approach is applied to a real environment.

In view of the forgoing, an object of the present disclosure is to provide a transmitter, etc. which transmits a signal using a transmission method more suitable for the real environment.

A transmitter according to one aspect for the present disclosure includes: a modulation circuit that modulates a data sequence using Quadrature Amplitude Modulation (QAM) by mapping the data sequence to only four symbols each of which differs in phase by 90 degrees from an adjacent one of the four symbols and at least two of which have different amplitudes; and a transmission circuit that wirelessly transmits the data sequence mapped to the four symbols through the modulation by the modulation circuit, by assigning the data sequence mapped to the four symbols through the modulation by the modulation circuit to different subcarriers for Orthogonal Frequency Division Multiplexing (OFDM).

These general and specific aspects may be implemented using a system, a method, an integrated circuit, a computer program, a computer-readable recording medium such as a CD-ROM, or any combination of systems, methods, integrated circuits, computer programs, or computer-readable recording media.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

A transmitter according to one aspect for the present disclosure can transmit a signal using a transmission method more suitable for a real environment.

Figure 1:
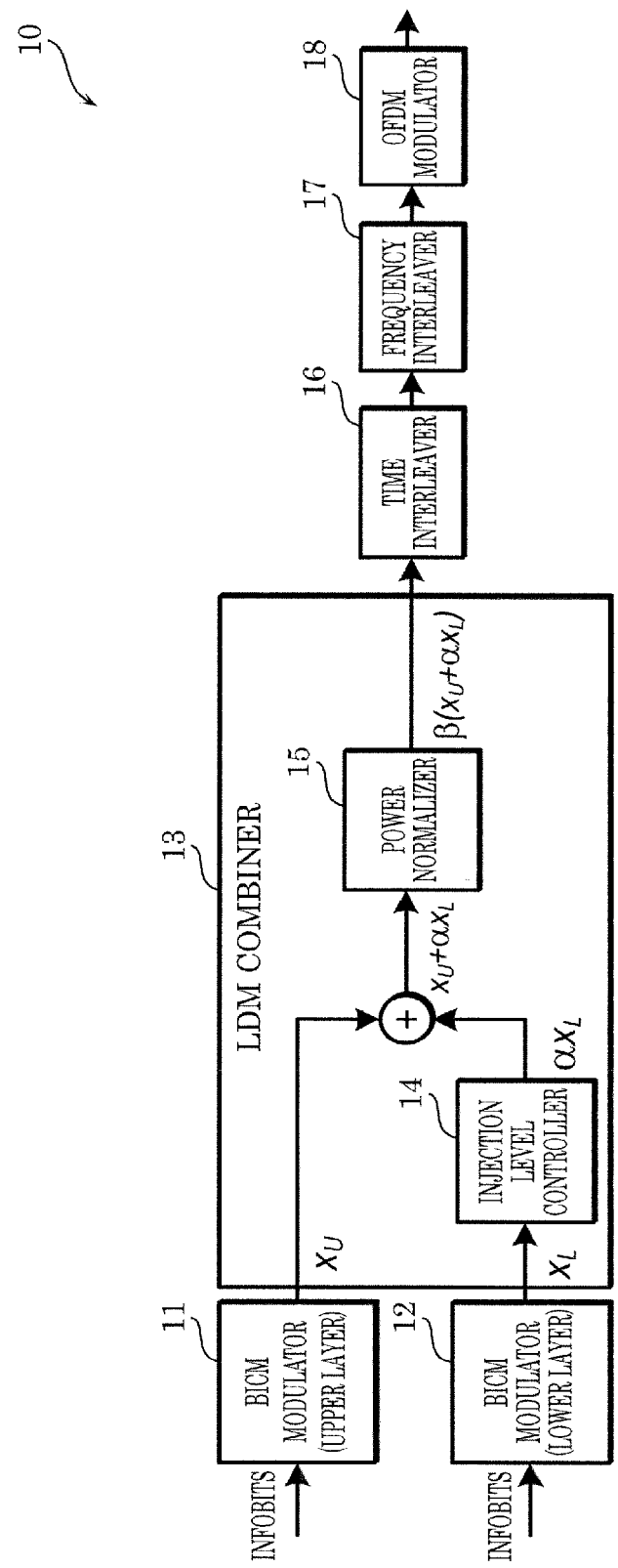
FIG. 1 illustrates a transmitter which carries out constellation superposition for two-layer LDM in ATSC 3.0, according to an embodiment.

DETAILED DESCRIPTION OF THE EMBODIMENT (Underlying Knowledge Forming Basis of the Present Disclosure)

The present disclosure relates to asymmetric QAMs and matched bit-interleaving for superposition modulation. The present disclosure applies to the field of digital communications in the context of broadcasting digital data, and more specifically to a novel transmission technique for a recent multiplexing method, which is based on superposition, for delivering different service types simultaneously to stationary and mobile users.

Multiplexing multiple signals into a compound signal is a common method in data communications to share a single medium. Traditionally, data carrying different services is multiplexed in time or frequency. These methods are called Time-Division-Multiplex (TDM) and Frequency-Division-Multiplex (FDM). Real-world applications for TDM and FDM can be found in DVB-T2 (NPL 1), in which multiple so-called PLPs (Physical Layer Pipes), each characterized by their own modulation and time interleaver, are sharing a certain frequency band in dedicated time slots, and the Japanese ISDB-T standard with the prominent One-Seg system, in which data is carried in banded segments which are strictly separated in frequency domain thus allowing for power-saving partial reception of individual segments.

It has been long since known that FDM and TDM are not the most spectrally efficient methods to share a medium. Their benefit lays more with the ease of implementation. In NPL 2, it is shown that actually the superposition of different services increases the capacity over either TDM or FDM. Only recently this form of multiplexing has found its way into a current standard, namely ATSC 3.0, where it is called Layered-Division-Multiplexing (LDM) (NPL 3 and NPL 6: ATSC Standard-Physical Layer Protocol (A/322), June 2017).

Superposition modulation also is a core element of a recently proposed novel terrestrial broadcast system, called WiB, short for Wideband transmission with reuse factor 1 (NPL 4). In WiB, neighboring transmitters are transmitting individual services. Due to the implied reuse factor 1, a receiver particularly in the mush area between the transmitters will receive the sum signal of all transmitted signals. From the point of view of the receiver, however, the received signal looks like a signal obtained from layered-division multiplexing. Hence, with correctly designed FEC-coding and modulation schemes, a receiver is able to employ successive interference cancellation techniques to retrieve the data.

Intuitively, the edge of superposition modulation over TDM/FDM in capacity is obtained due to the simultaneous transmission of more than one service without pausing in either time domain or frequency domain. A particular use case for superposition modulation, for which also its benefit is most pronounced, is the provision of services to mobile and fixed receivers. Mobile and fixed receiving conditions are usually characterized by low and high signal-to-noise ratios (SNR), respectively. Here, the mobile service is carried with a data rate sufficiently low to withstand the low SNR as well as the presence of the fixed service. The receiver for the fixed service, on the other hand, can take advantage of a relatively high SNR and detect the robust mobile layer first, subtract its data and then proceed by detecting the actually desired data for the fixed service.

Regarding WiB, it was conjectured in NPL 5 that a power splitting approach may be beneficial in a broadcasting environment. Rather than using a uniform power distribution from each transmitter across the available bandwidth a non-uniform power distribution is suggested for iterative receiver implementations to operate close to capacity. However, the argument was made with idealized Gaussian signals.

As described above, there is room for improvement when the power splitting approach disclosed in NPL 5 is applied to a real environment.

In view of this, a transmitter according to one aspect for the present disclosure includes: a modulation circuit that modulates a data sequence using Quadrature Amplitude Modulation (QAM) by mapping the data sequence to only four symbols each of which differs in phase by 90 degrees from an adjacent one of the four symbols and at least two of which have different amplitudes; and a transmission circuit that wirelessly transmits the data sequence mapped to the four symbols through the modulation by the modulation circuit, by assigning the data sequence mapped to the four symbols through the modulation by the modulation circuit to different subcarriers for Orthogonal Frequency Division Multiplexing (OFDM).

According to the above aspect, QAM demodulation can be successfully performed even if another transmitter whose coverage area at least partially overlaps with that of one transmitter exists and the another transmitter transmits a signal on the same subcarrier. This is because at least two of the four symbols used for the QAM have different amplitudes, and thus symbols can be laid out so as to prevent symbols applied to the QAM by one transmitter from coinciding with symbols applied to the QAM by another transmitter. Therefore, the transmitter according to one aspect of the present disclosure can transmit a signal using the transmission method more suitable for the real environment. Please note that this QAM is also referred to as asymmetric QAM.

For example, two of the four symbols which differ in phase by 180 degrees may have an equal distance from an origin in IQ plane, and another two of the four symbols may, have an equal distance from the origin in the IQ plane.

According to the above aspect, the transmitter can more easily transmit the data sequence using the QAM.

For example, the data sequence may include first data and second data preceding or following the first data, the modulation circuit may modulate the first data by mapping the first data to symbols based on gray code constellation, and modulate the second data by mapping the second data to symbols based on non-gray code constellation, and the transmission circuit may transmit the first data modulated and the second data modulated in a time division manner. According to the above aspect, both of the gray and non-gray code constellations having different tolerances for error can be used in the time division manner, thereby enhancing the tolerance for error in comparison with the case where either one of them is used.

For example, the data sequence may include third data and fourth data preceding or following the third data, the modulation circuit may modulate the third data by mapping the third data to symbols based on gray code constellation, and modulate the fourth data by mapping the fourth data to symbols based on non-gray code constellation, and the transmission circuit may transmit the third data modulated by assigning the third data modulated to a subcarrier to be transmitted in a first frequency band, and transmit the fourth data modulated by assigning the fourth data modulated to a subcarrier to be transmitted in a second frequency band different from the first frequency band.

According to the above aspect, both of the gray and non-gray code constellations having different tolerances for error can be used in the frequency division manner, thereby enhancing the tolerance for error in comparison with the case where either one of them is used.

For example, the data sequence may include fifth data and sixth data preceding or following the fifth data, the modulation circuit may modulate the fifth data using the QAM, and modulate the sixth data using Quadrature Phase Shift Keying (QPSK), and the transmission circuit may transmit the fifth data modulated by assigning the fifth data modulated to a subcarrier to be transmitted with first power, and transmit the sixth data modulated by assigning the sixth data modulated to a subcarrier to be transmitted with second power lower than the first power.

According to the above aspect, in LDM, it is possible to transmit a signal on a low power subcarrier while the tolerance for signal error of high power subcarrier is enhanced by the asymmetric QAM.

For example, the data sequence may include a Low-Density Parity-Check (LDPC) code, the transmitter may further include a bit-interleaver that rearranges bits in the data sequence so that the fifth data to be modulated by the modulation circuit becomes a large degree node of the LDPC code having a degree larger than a predetermined degree, in which the modulation circuit may modulate the data sequence after the rearrangement by the bit-interleaves.

According to the above aspect, it is possible to cause the receiver to more reliably receive relatively large degree nodes of the LDPC code, i.e. bits having a relatively high error-correction capability in decoding the data sequence. This increases the probability of decoding the entire data sequence. For example, the modulation circuit may modulate, as the four symbols, new four symbols obtained by rotating the four symbols by a predetermined angle about an origin in IQ plane.

According to the above aspect, it is possible to prevent original four symbols from coinciding with new four symbols in IQ plane (i.e. a complex plane). With this, QAM demodulation can be successfully performed even if another transmitter whose coverage area at least partially overlaps with that of one transmitter exists and the another transmitter transmits a signal on the same subcarrier.

For example, the transmitter may be one of a plurality of transmitters whose coverage areas at least partially overlap one another, and the predetermined angle may be obtained by dividing 180 degrees by the number of the plurality of transmitters.

According to the above aspect, when another transmitter whose coverage area at least partially overlaps with that of one transmitter exists, their symbols in IQ plane can be apart from each other as far as possible. This decreases the probability of reception error.

Furthermore, a receiver according to one aspect for the present disclosure includes: a reception circuit that receives a signal modulated using Quadrature Amplitude Modulation (QAM) by mapping a data sequence to only four symbols each of which differs in phase by 90 degrees from an adjacent one of the four symbols and at least two of which have different amplitudes, and wirelessly transmitted by assigning the data sequence mapped to the four symbols to different subcarriers for Orthogonal Frequency Division Multiplexing (OFDM); and a demodulation circuit that demodulates the signal received by the reception circuit, using the QAM by mapping the signal received by the reception circuit to the four symbols.

According to the above aspect, the receiver can receive the signal modulated by the transmitter using the asymmetric QAM and wirelessly transmitted by the transmitter, and demodulate the received signal into the original data sequence. The receiver according to one aspect of the present disclosure can receive the signal transmitted by the transmitter using the transmission method more suitable for the real environment.

Furthermore, a transmission method according to one aspect for the present disclosure includes: modulating, with a modulation circuit, a data sequence using Quadrature Amplitude Modulation (QAM) by mapping the data sequence to only four symbols each of which differs in phase by 90 degrees from an adjacent one of the four symbols and at least two of which have different amplitudes; and wirelessly transmitting, with a transmission circuit, the data sequence mapped to the four symbols through the modulation circuit by assigning the data sequence mapped to the four symbols through the modulation circuit to different subcarriers for Orthogonal Frequency Division Multiplexing (OFDM).

According to the above aspect, the transmission method produces the same advantageous effects as the above transmitter.

Furthermore, a reception method according to one aspect for the present disclosure includes: receiving, with a reception circuit, a signal modulated using Quadrature Amplitude Modulation (QAM) by mapping a data sequence to only four symbols each of which differs in phase by 90 degrees from an adjacent one of the four symbols and at least two of which have different amplitudes, and wirelessly transmitted by assigning the data sequence mapped to the four symbols to different subcarriers for Orthogonal Frequency Division Multiplexing (OFDM); and demodulating, with a demodulation circuit, the signal received by the reception circuit, using the QAM by mapping the signal received by the reception circuit to the four symbols.

According to the above aspect, the reception method produces the same advantageous effects as the above receiver.

These general and specific aspects may be implemented using a system, a method, an integrated circuit, a computer program, a computer-readable recording medium such as a CD-ROM, or any combination of systems, methods, integrated circuits, computer programs, or computer-readable recording media.

Hereinafter, an embodiment will be described with reference to the drawings.

It should be noted that the subsequently-described embodiment shows a generic or specific example of the present disclosure. Therefore, numerical values, shapes, materials, structural components, the arrangement and connection of the structural components, etc. shown in the following embodiment are mere examples, and are not intended to limit the scope of the present disclosure. Furthermore, among the structural components in the following embodiment, components not recited in the independent claim which indicates the broadest concept of the present disclosure are described as arbitrary structural components.

Embodiment

In this embodiment, a transmitter, etc. which transmits a signal using a transmission method more suitable for a real environment will be described.

Firstly, the outline of a transmitter according to the embodiment will be described.

The author of in this disclosure proposes two concrete measures to realize the concept.

The first measure is an asymmetric QAM. In its most simple form it may be based on a QPSK signal for which two symbols diametrically opposing across the origin in IQ plane are given larger amplitude at the expense of the remaining two symbols. The bit-mapping in such a case may be chosen preferably in a non-Gray manner in order for the two closer symbols to be differing only in a single bit. If a second transmitter uses the same asymmetric QAM but rotated by 90 degrees, then the effect is that symbols with larger amplitude from one transmitter are coinciding with symbols having smaller amplitude resulting in a larger SINR for these symbol combinations. The concept can be extended to higher order QAMs by correspondingly skewing or shearing the regular rectangular symbol constellation.

The second measure is a bit-interleaver which is different for each transmitter in a particular and particularly matched for the purpose of the effects of power splitting. The background here is that all deployed LDPC-FEC codes in the field have an irregular variable node distribution. Roughly speaking there are variable nodes with high, medium and low degrees. The degree determines the number of connections a node has to other neighboring nodes. It is thus important that a variable node of high degree is also provided with a reliable input from the demapper output. This matching of variable nodes to the demapper output is accomplished by the bit-interleaver. A naive design would use the same bit-interleaver for all transmitters. The proposal here is to employ a bit-interleaver which is matched to the power-splitting ratio of the transmitters such that variable nodes of high degree match with the portion of the frequency band with high power.

A receiver based on EP16203534.9 "Iterative Demapping for Superposition Modulation" (Patent Literature 1) would then be ideally prepared to detect the signals from two or more transmitters.

This disclosure comprises the asymmetric QAM ("aQAM" for short) for the purpose of realizing a power splitting and a bit-interleaver which matches the variable nodes of an LDPC code favorably to the power distribution on the channel.

Hereinafter, the transmitter according to the embodiment will be described in detail.

(1) Layered Division Multiplexing (LDM)

FIG. 1 illustrates transmitter 10 which carries out constellation superposition for two-layer LDM in ATSC 3.0.

The general concept of LDM is illustrated in FIG. 1 for two layers. Depending on the context, these layers are called either Upper and Lower layer or Mobile and Fixed or Stationary layer. Note also that in ATSC 3.0, the Upper layer is called Core layer, and the Lower layer Enhanced layer. Other than that Layered-Division-Multiplexing was specified as depicted in FIG. 1.

In principle, of course, more than two layers are conceivable. Both layers can carry one or more PLPs. The Upper layer carries a low-rate service $x_U$ aimed at mobile reception, while the Lower layer carries a high-rate service $x_L$ aimed at stationary reception.

Transmitter 10 includes upper layer BICM modulator 11 that performs Bit-Interleaved Coded Modulation (BICM) on the information bits inputted in the upper layer and provides the low-rate service $x_U$, and lower layer BICM modulator 12 that performs BICM on the information bits inputted in the lower layer and provides the high-rate service $X_L$.

LDM combiner 13 includes level controller 14 (also referred to as an injection level controller) and power normalizer 15.

Level controller 14 provides a positive scaling factor $\alpha \le 1$ which may reduce the power of the lower layer, followed by a superposition of the two layers yielding the non-normalized signal $x_U + \alpha x_L$. Subsequently, power normalizer 15 normalizes the compound signal to unit power via an appropriate scaling factor $\beta$ before the compound signal is passed through time interleaver 16 (TI), frequency interleaver 17 (FI), and OFDM modulator 18 and framing stage (not shown), which are added here for completeness' sake.

Here, the upper layer BICM modulator and the lower layer BICM modulator each correspond to a modulation circuit. OFDM modulator 18 and the framing stage correspond to a transmission circuit.

In general terms, the operation of the receiver corresponding to transmitter 10 is understood such that a mobile receiver, which is interested in the Upper layer only, also detects the Upper layer only. A stationary receiver interested in the Lower layer is required to perform successive interference cancellation, i.e., the Upper layer is detected first. Then, assuming that the Upper layer is detected successfully, the receiver remodulates the detected Upper layer and the remodulated cells are subtracted from the received cells followed by detection of the Lower layer.

(1.1) Wideband-Transmission (WiB)

In NPL 4, a next generation DTT system is described which utilizes a frequency reuse factor of 1 and thus allows transmitters explicitly to interfere. Additional aspects of WiB are the use of a very large bandwidth (for example, the whole remaining UHF-band currently used for traditional DTT amounting to roughly 220 MHz) and a highly robust transmission mode in order to cope with the interference and thus a starkly reduced transmission power compared to traditional transmission concepts.

Figure 2:
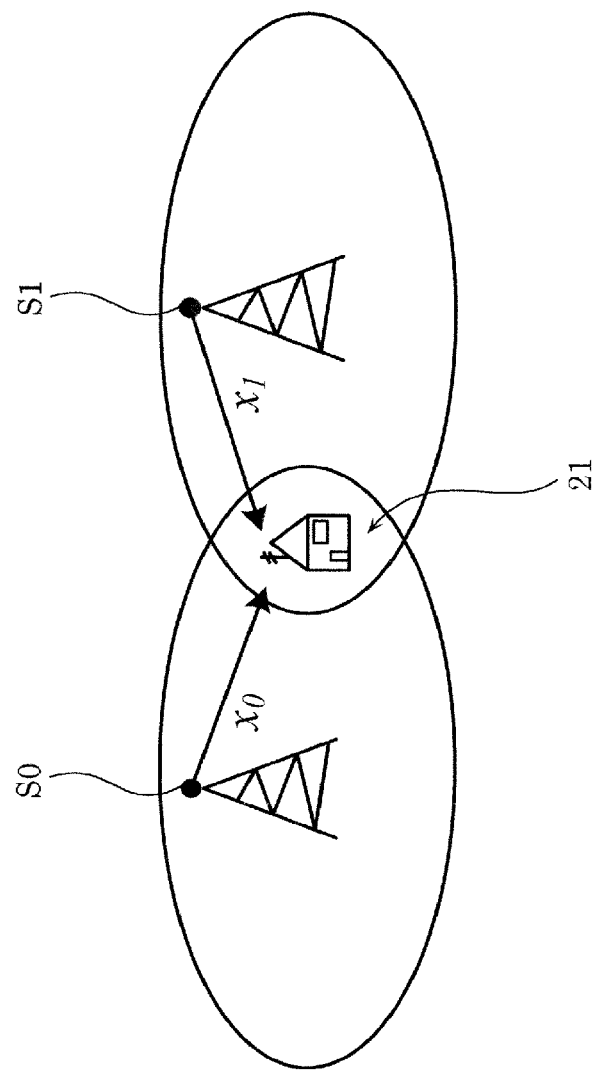
FIG. 2 illustrates a WiB's transmission scenario according to the embodiment.

FIG. 2 illustrates the concept of WiB for two transmitters S0 and S1 emitting signals $x_0$ and $x_1$ in the same frequency band. The ellipses shown in FIG. 2 represent the coverage area of the transmitters. The receiver in mush area 21 will observe the sum signal of both transmitted signals.

As shown above, LDM and WiB are particular instances of Superposition Modulation (SM). While LDM explicitly adds transmit signals at the transmitter, WiB implicitly leads to the summation of signals transmitted from different transmitters at the receiver which is due to the usage of the same frequency band.

Figure 3:
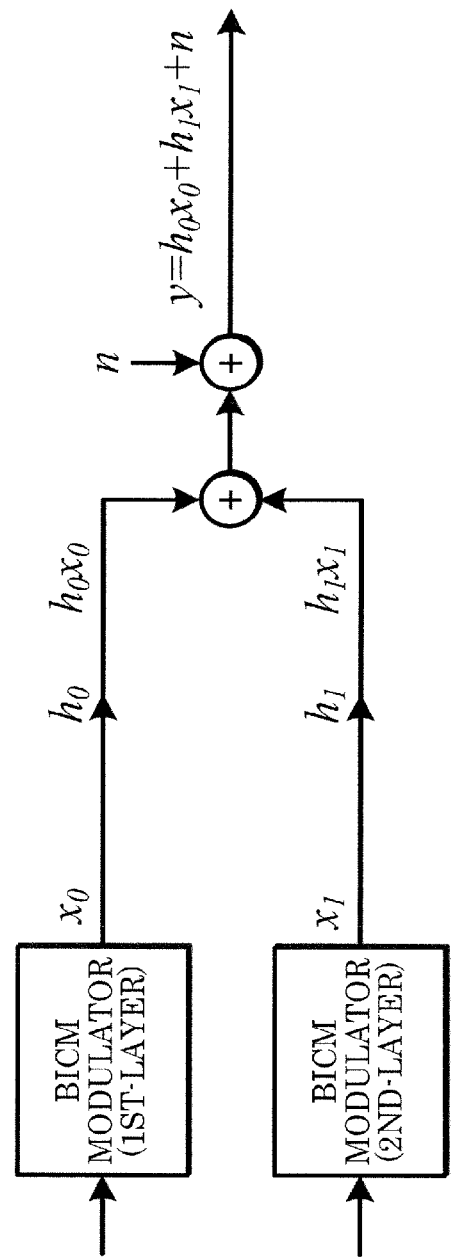
FIG. 3 illustrates a system model for superposition modulation applicable to LDM and WiB with two layers, according to the embodiment.

Thus, in principle, for the receiver front-end it is irrelevant in which way the superposition occurred. A system model applicable to both, LDM and WiB, is shown in FIG. 3. The coefficients $h_0$ and $h_1$ can serve either as scaling factors or as channel coefficients. In the former case the system model represents LDM, in the latter case it represents WiB.

(2) Power Splitting

Figure 4:
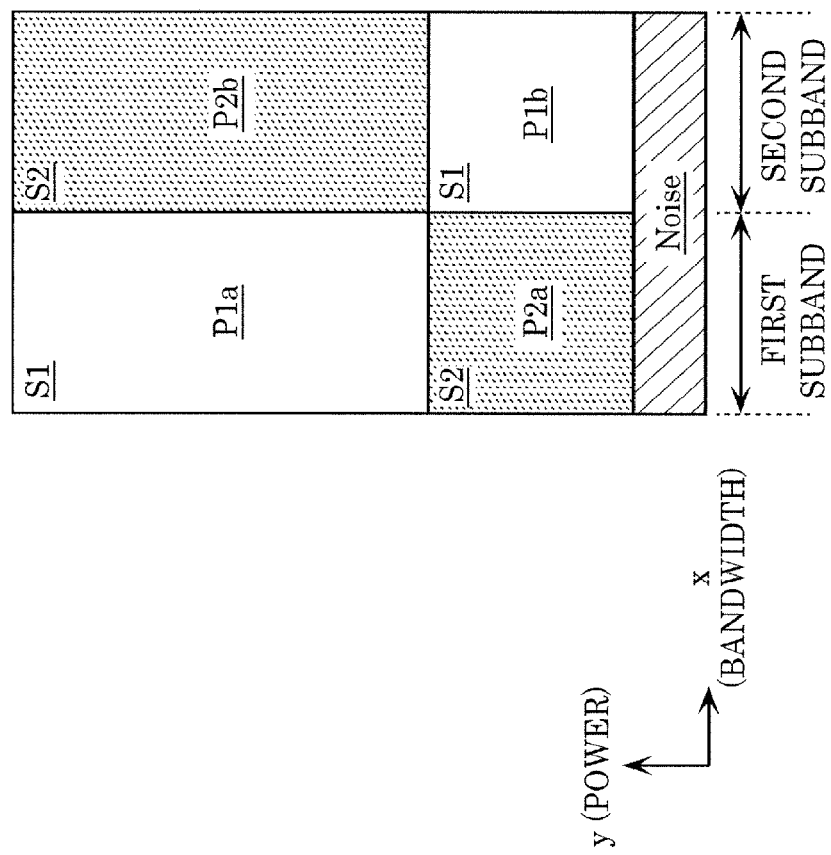
FIG. 4 illustrates a power distribution according to the embodiment.

The core idea from NPL 5 is depicted in FIG. 4. The x-axis is to be understood as the useful bandwidth, the y-axis is to be understood as power. Two transmitters are assumed to share this bandwidth split in halve. First transmitter S0 employs a larger power P1a in the first subband and a smaller power P1b in the second subband. Second transmitter S1 operates in an opposite manner, i.e. second transmitter S1 employs a larger power P2b in the second subband and a smaller power P2a in the first subband.

(3) Asymmetric QAM (aQAM)

The modulation circuit (i.e. modulator) modulates a data sequence using QAM by mapping the data sequence to only four symbols each of which differs in phase by 90 degrees from an adjacent one of the four symbols and at least two of which have different amplitudes. Furthermore, the transmission circuit wirelessly transmits the data sequence mapped to the four symbols through the modulation by the modulation circuit, by assigning the data sequence mapped to the four symbols through the modulation by the modulation circuit to different subcarriers for OFDM. The modulation method using the above QAM is also referred to as asymmetric QAM.

In particular, two of the four symbols which differ in phase by 180 degrees have an equal distance from an origin in IQ plane, and another two of the four symbols have an equal distance from the origin in the IQ plane.

The aQAM is described in detail below.

Figure 5:
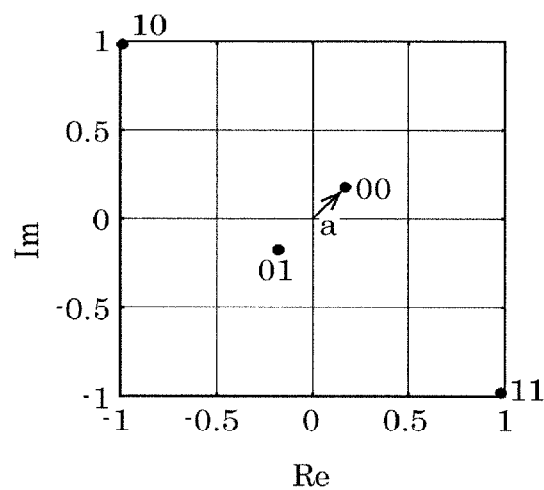
FIG. 5 illustrates a non-gray mapped aQam for the first of two transmitters, according to the embodiment.

FIG. 5 shows exemplary symbols of an asymmetric QAM in IQ plane. The scalar 'a' denotes the amplitude of the first symbol carrying the bit label 00. The directly opposing and closest symbol is given the bit-label 01, and thus the bit-mapping is entirely configured as a non-Gray mapping. Please note that the non-Gray mapping means that data is mapped to symbols based on non-Gray code constellation.

The symbol alphabet for an asymmetric QAM with four symbols and non-Gray mapping can be described as the following Equation 1.

$$A_{non-Gray} = \left\{ \frac{a}{\sqrt{2}}(1+j), \frac{a}{\sqrt{2}}(-1-j), \frac{\sqrt{2-a^2}}{\sqrt{2}}(-1+j), \frac{\sqrt{2-a^2}}{\sqrt{2}}(1-j) \right\}$$ (Equation 1)

In this case, for the second transmitter, the symbol alphabet is rotated counterclockwise by 90 degrees about the origin in IQ plane. An example is shown in FIG. 6.

Figure 6:
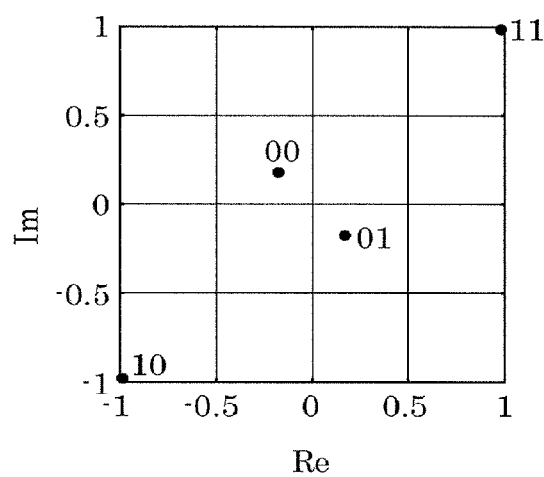
FIG. 6 illustrates a non-gray mapped aQam for the second of two transmitters, according to the embodiment.

Please note that in other words, the constellations shown in FIG. 5 and FIG. 6 each correspond to a constellation in which the amplitudes of bit labels 11 and 10 are scaled up based on the QPSK constellation.

Figure 7:
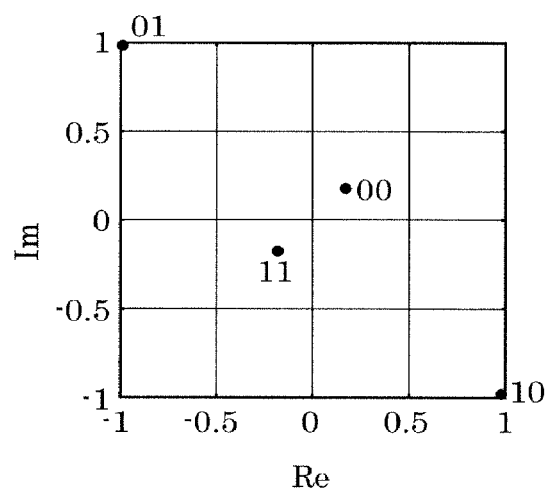
FIG. 7 illustrates a gray mapped aQam for the first of two transmitters, according to the embodiment.

The symbol alphabet for an asymmetric QAM with four symbols and Gray mapping can be described as the following Equation 2. An example is shown in FIG. 7. Please note that the Gray mapping means that data is mapped to symbols based on Gray code constellation.

$$A_{Gray} = \left\{ \frac{a}{\sqrt{2}}(1+j), \frac{\sqrt{2-a^2}}{\sqrt{2}}(-1+j), \frac{\sqrt{2-a^2}}{\sqrt{2}}(1-j), \frac{a}{\sqrt{2}}(-1-j) \right\}$$ (Equation 2)

In this case, in a similar manner to the non-gray mapping, for the second transmitter, the symbol alphabet is rotated counterclockwise by 90 degrees about the origin in IQ plane. An example is shown in FIG. 8.

Figure 8:
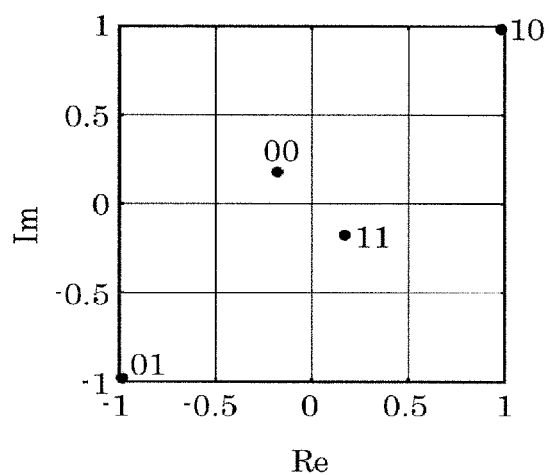
FIG. 8 illustrates a gray mapped aQam for the second of two transmitters, according to the embodiment.

Please note that in other words, the constellations shown in FIG. 7 and FIG. 8 each correspond to a constellation in which the amplitudes of bit labels 01 and 10 are scaled up based on the QPSK constellation.

Figure 9:
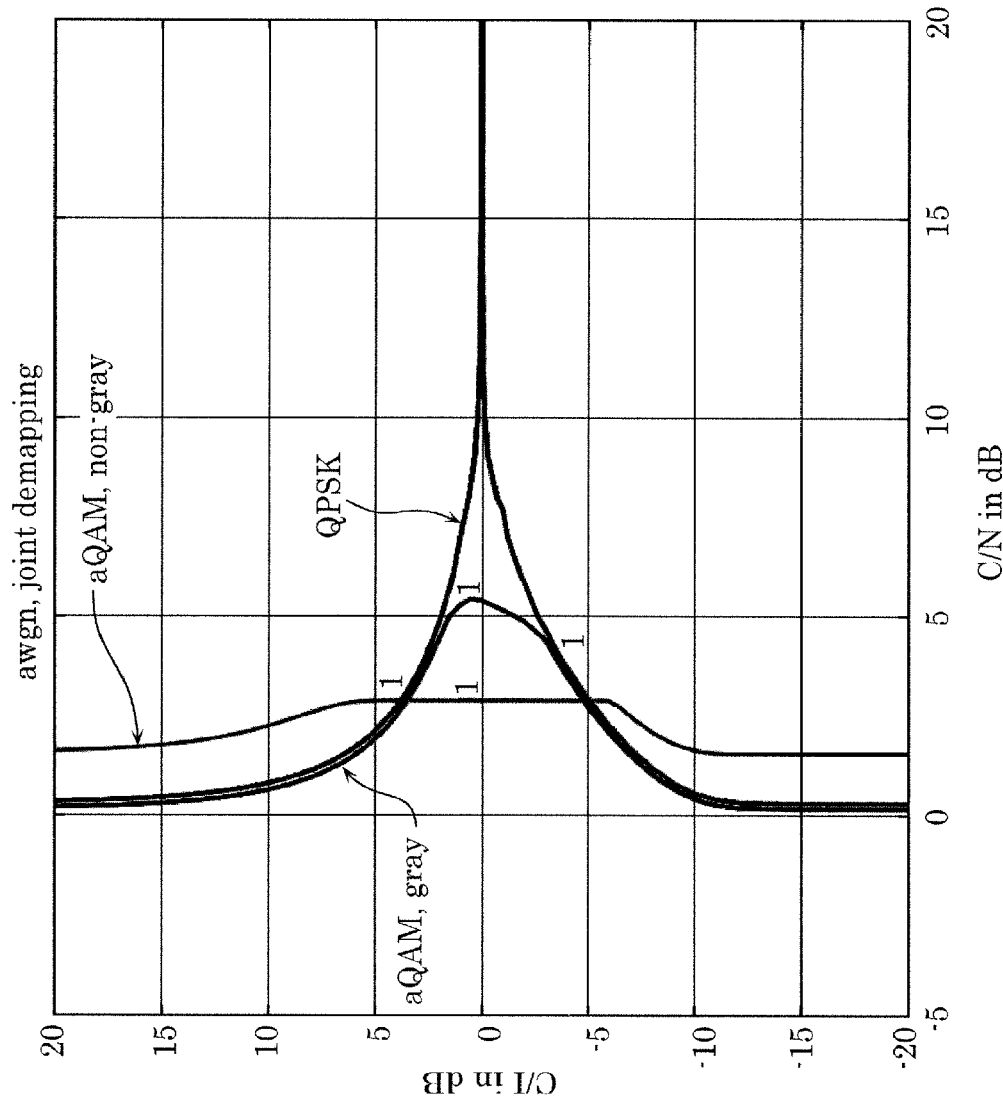
FIG. 9 illustrates the 1 bit/s/Hz rate for joint demapping and different C/I and C/N conditions and two transmitters, according to the embodiment.

To appreciate the possible performance gains FIG. 9 shows the 1 bit/s/Hz-contours for asymmetric QAM for various C/I and C/N dB conditions in an Additive White Gaussian Noise (AWGN) channel.

Especially for C/I 0 dB when the two transmitted signals are received with like power the traditional transmission with QPSK requires very high SNR since certain symbol combinations result in a complete erasure. For C/I of 0 dB, the aQAM with non-Gray mapping shows the best performance among three modulation methods shown in FIG. 9.

On the other hand, for very high or very low C/I, the asymmetric QAM incurs a loss. Here, the aQAM takes on the shape a QPSK however with a non-Gray mapping. Hence, in one embodiment of the disclosure a mixture of gray-mapped and non-gray-mapped asymmetric QAMs with a FEC-block is envisioned.

For example, the gray-mapped and non-gray-mapped asymmetric QAMs are mixed in a time division manner. More specifically, when the data sequence includes first data and second data preceding or following the first data, the modulation circuit modulates the first data by mapping the first data to symbols based on gray code constellation, and modulates the second data by mapping the second data to symbols based on non-gray code constellation. Then, the transmission circuit transmits the first data modulated and the second data modulated in a time division manner.

Furthermore, for example, the gray-mapped and non-gray-mapped asymmetric QAMs are mixed in a frequency division manner. More specifically, when the data sequence includes third data and fourth data preceding or following the third data, the modulation circuit modulates the third data by mapping the third data to symbols based on gray code constellation, and modulates the fourth data by mapping the fourth data to symbols based on non-gray code constellation. Then, the transmission circuit transmits the third data modulated by assigning the third data modulated to a subcarrier to be transmitted in a first frequency band, and transmits the fourth data modulated by assigning the fourth data modulated to a subcarrier to be transmitted in a second frequency band different from the first frequency band.

Please note that in the foregoing explanation, when two transmitters exist, the constellation of symbols to be transmitted by one of the two transmitters is rotated by 90 degrees. In other words, more generally, the modulation circuit may modulate, as the four symbols, new four symbols obtained by rotating the four symbols by a predetermined angle about an origin in IQ plane. In addition, when two or more transmitters whose coverage areas at least partially overlap one another exist, the constellation may be rotated by the angle obtained by dividing 180 degrees by the number of the transmitters.

Figure 10:
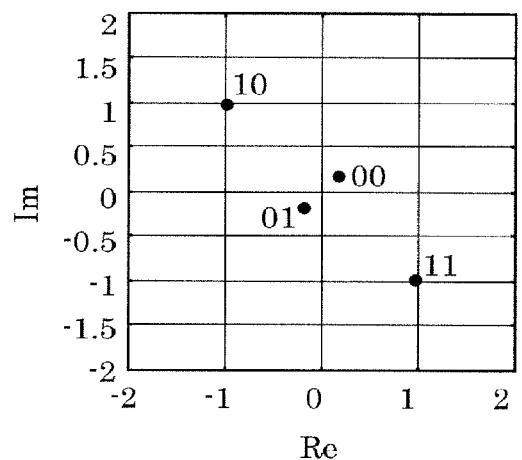
FIG. 10 illustrates an aQam for the first of three transmitters, according to the embodiment.
Figure 11:
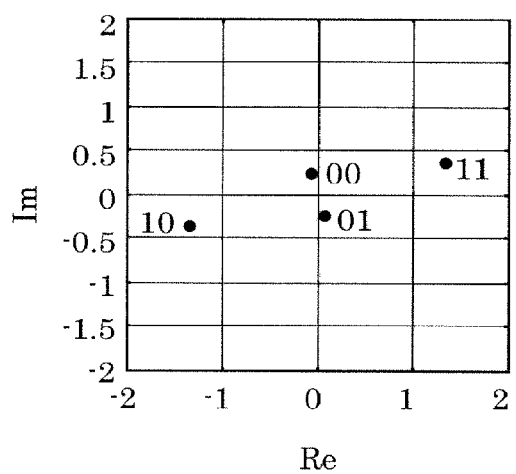
FIG. 11 illustrates an aQam for the second of three transmitters, according to the embodiment.
Figure 12:
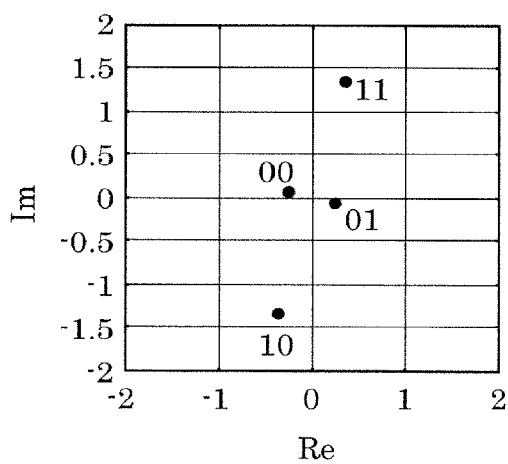
FIG. 12 illustrates an aQam for the third of three transmitters, according to the embodiment.

In particular, for three transmitters, the symbol alphabet is rotated by 60 degrees. This is to create always symbol constellation which never result in erasures. Individual examples for the three transmitters are shown in FIG. 10, FIG. 11, and FIG. 12.

(3.1) Power Splitting and Asymmetric QAM

Figure 13:
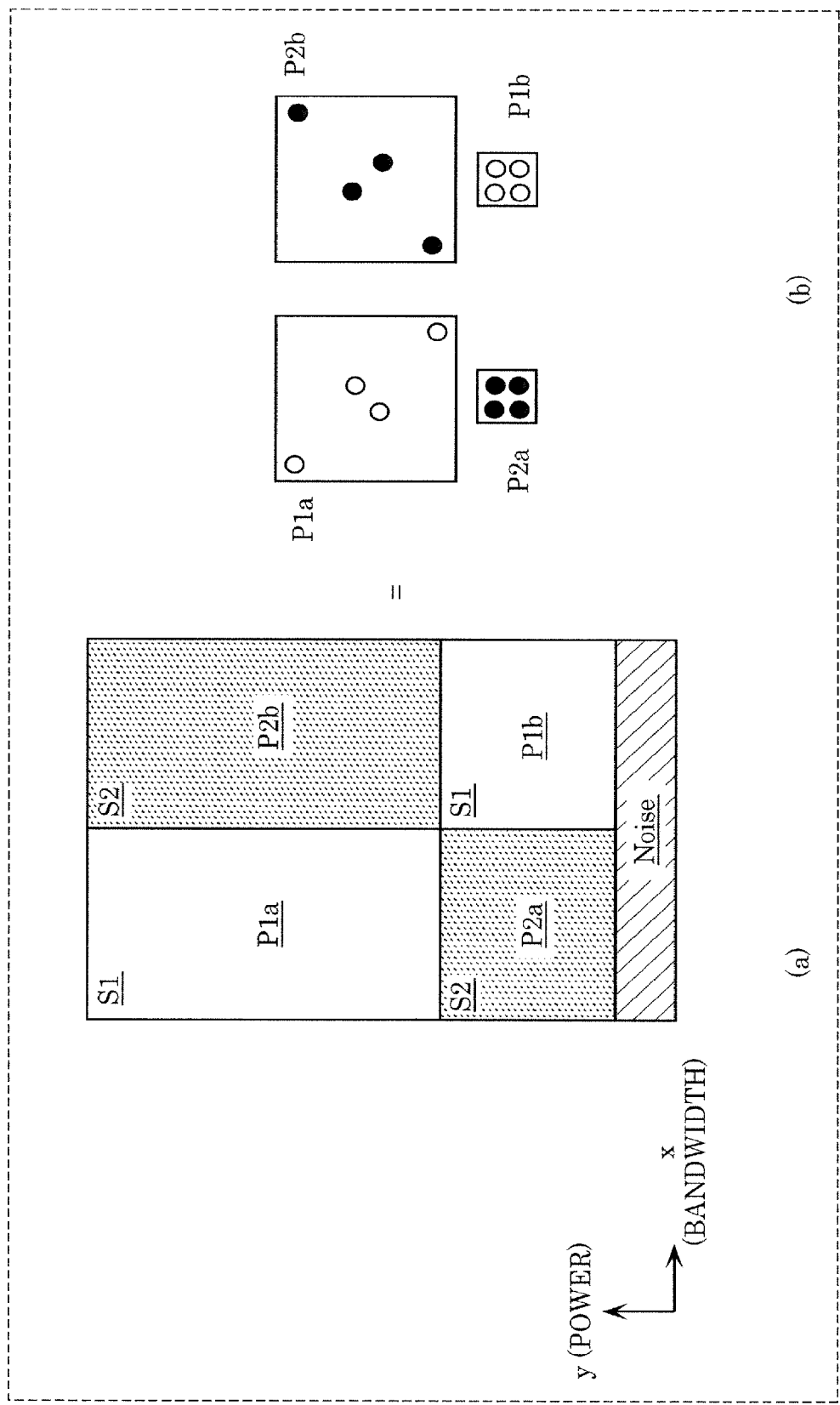
FIG. 13 illustrates translating of the power splitting concept to QAM-signals for two transmitters, according to the embodiment.

A translation of the concept of power splitting to QAM signals is shown in FIG. 13. The high power signals employ the asymmetric QAM and the lower power signals a traditional QPSK signal reduced power.

In particular, when the data sequence includes fifth data and sixth data preceding or following the fifth data, the modulation circuit modulates the fifth data using the QAM, and modulates the sixth data using Quadrature Phase Shift Keying (QPSK). Then, the transmission circuit transmits the fifth data modulated by assigning the fifth data modulated to a subcarrier to be transmitted with first power, and transmits the sixth data modulated by assigning the sixth data modulated to a subcarrier to be transmitted with second power lower than the first power. Please note that the transmitter may be characterized in that the range of power used to transmit the high power signal is larger than that of power used to transmit the low power signal. This provides an advantage of using the asymmetric QAM together with the high power signal having a relatively large power range.

Figure 14:
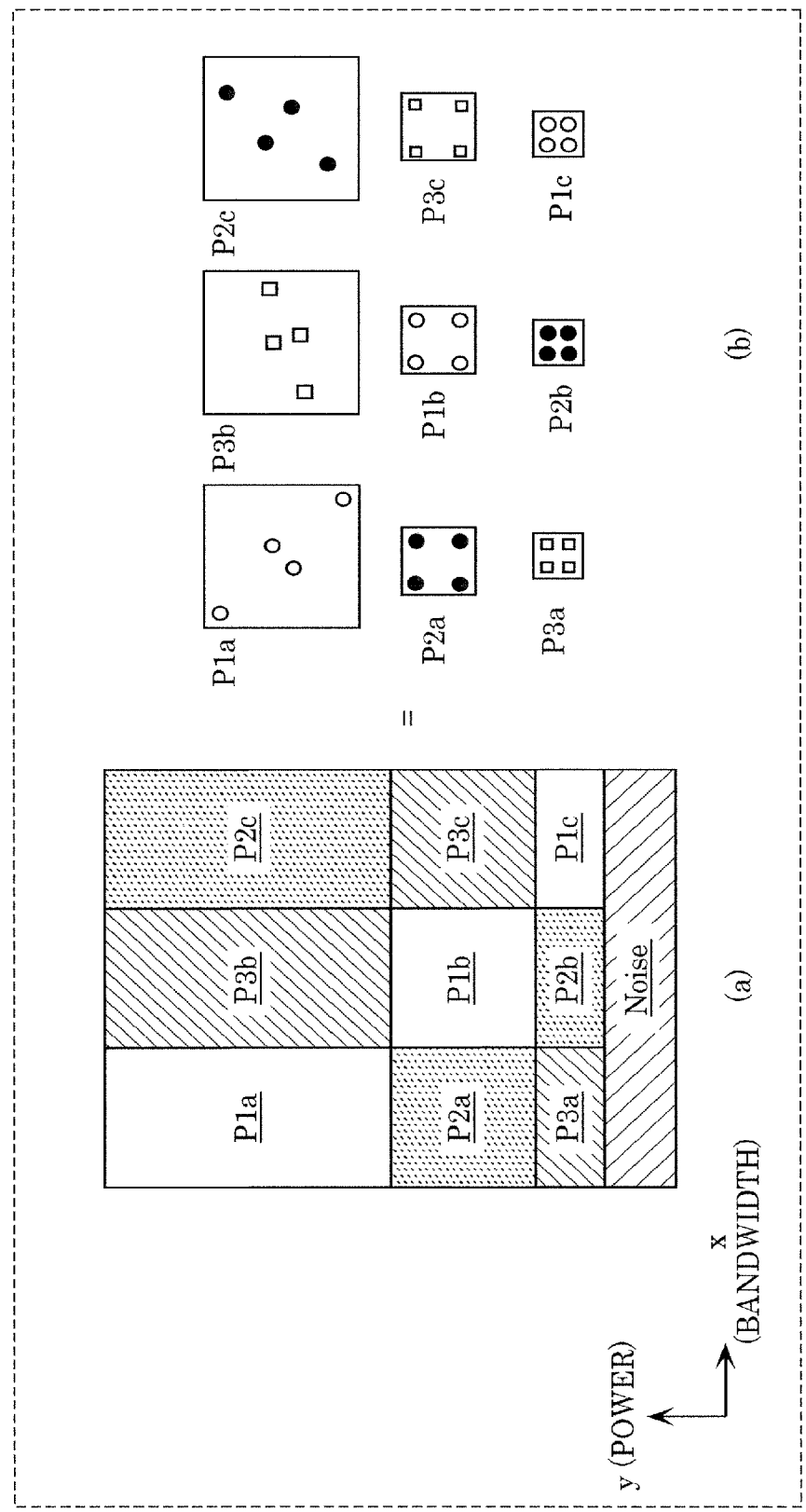
FIG. 14 illustrates translating of the power splitting concept to QAM-signals for three transmitters, according to the embodiment.

If more than two transmitters are considered NPL 5 proposes a further power split into three partitions. The concept is shown realized in FIG. 14. The high power signals are carried with an asymmetric QAM, the low power signals by a low-powered QPSK signal.

Please note that the relative power levels are subject to network design and can be assigned at the time of deployment. Furthermore these levels are assumed to be signaled in L1-signalling and known to the receiver at the point of time of data detection.

(4) Irregular LDPC Codes

Figure 15:
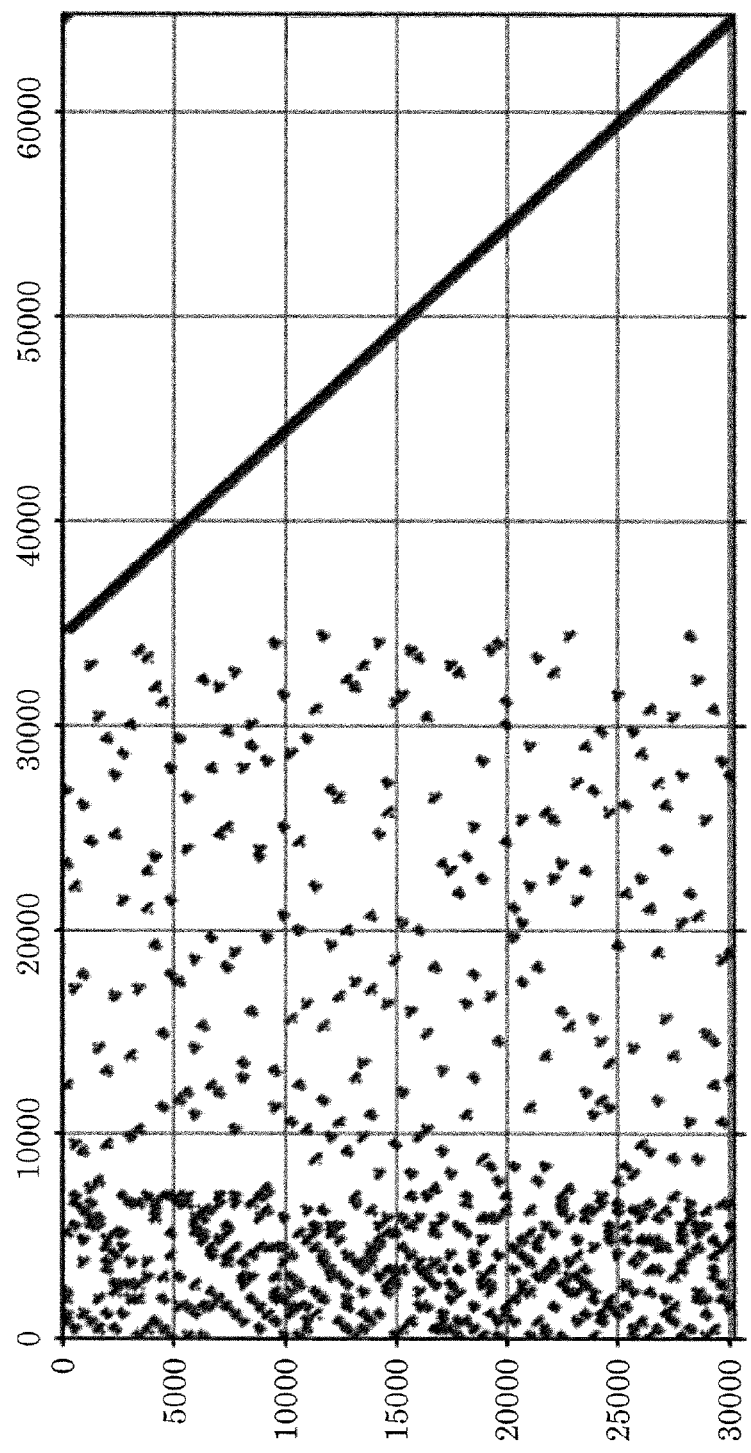
FIG. 15 illustrates a parity check matrix from ATSC 3.0 for coderate 8/15, according to the embodiment.

A typical parity check from ATSC 3.0 for a long LDPC code with coderate 8/15 is shown in FIG. 15. The larger density of checked nodes in front of the parity check matrix is clearly visible.

Figure 16:
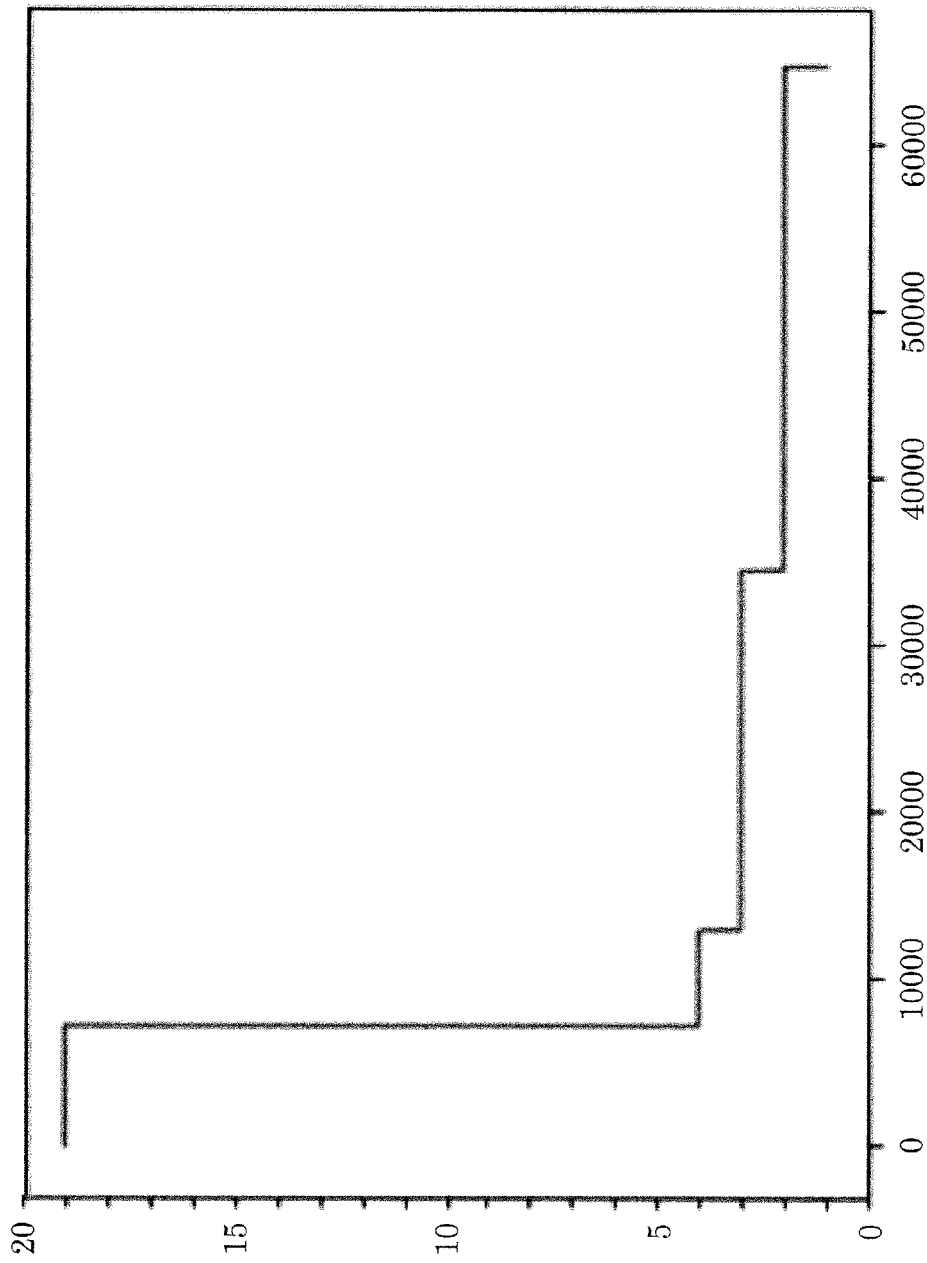
FIG. 16 illustrates a variable node degree distribution for the LDPC of code rate 8/15, according to the embodiment.

And the edge degree distribution can be plotted explicitly by summing all entries of the parity check matrix for each column. The result is shown in FIG. 16. The largest portion variable nodes have degrees of two and three and there is a moderately large group of variable nodes with the largest degree of 19 in this case. It is this latter group of high-degree variable nodes which is in the focus of this disclosure.

(5) Power Splitting and Matching Bit-Interleavers

Figure 17:
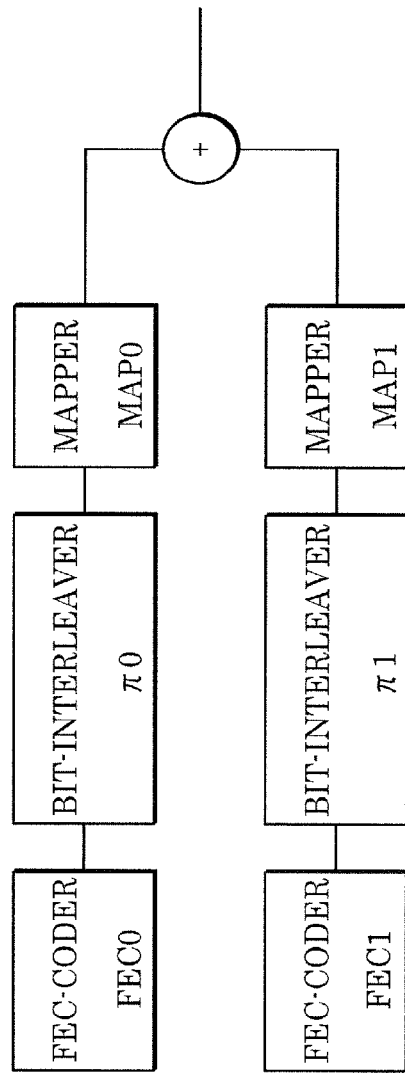
FIG. 17 illustrates superposition-modulation with two transmitters, according to the embodiment.

FIG. 17 is a diagram for superposition modulation with two transmitters. The bit-interleavers-$\pi 0$ and $\pi 1$- are the connecting element between FEC-coders and mappers.

For the sake of the argument, we can assume that bit-interleaver $\pi 0$ is sequence of numbers from 0 up to the FEC-codeword length minus 1, i.e., the neutral element with regards to bit-interleaving and bit-interleaver $\pi 1$ is the reversed sequence from FEC-codeword length minus 1 to 0. In other words, bit-interleaver $\pi 0$ outputs the inputted bit sequence without any change, whereas bit-interleaver $\pi 1$ outputs the inputted bit sequence in reverse order.

Figure 18:
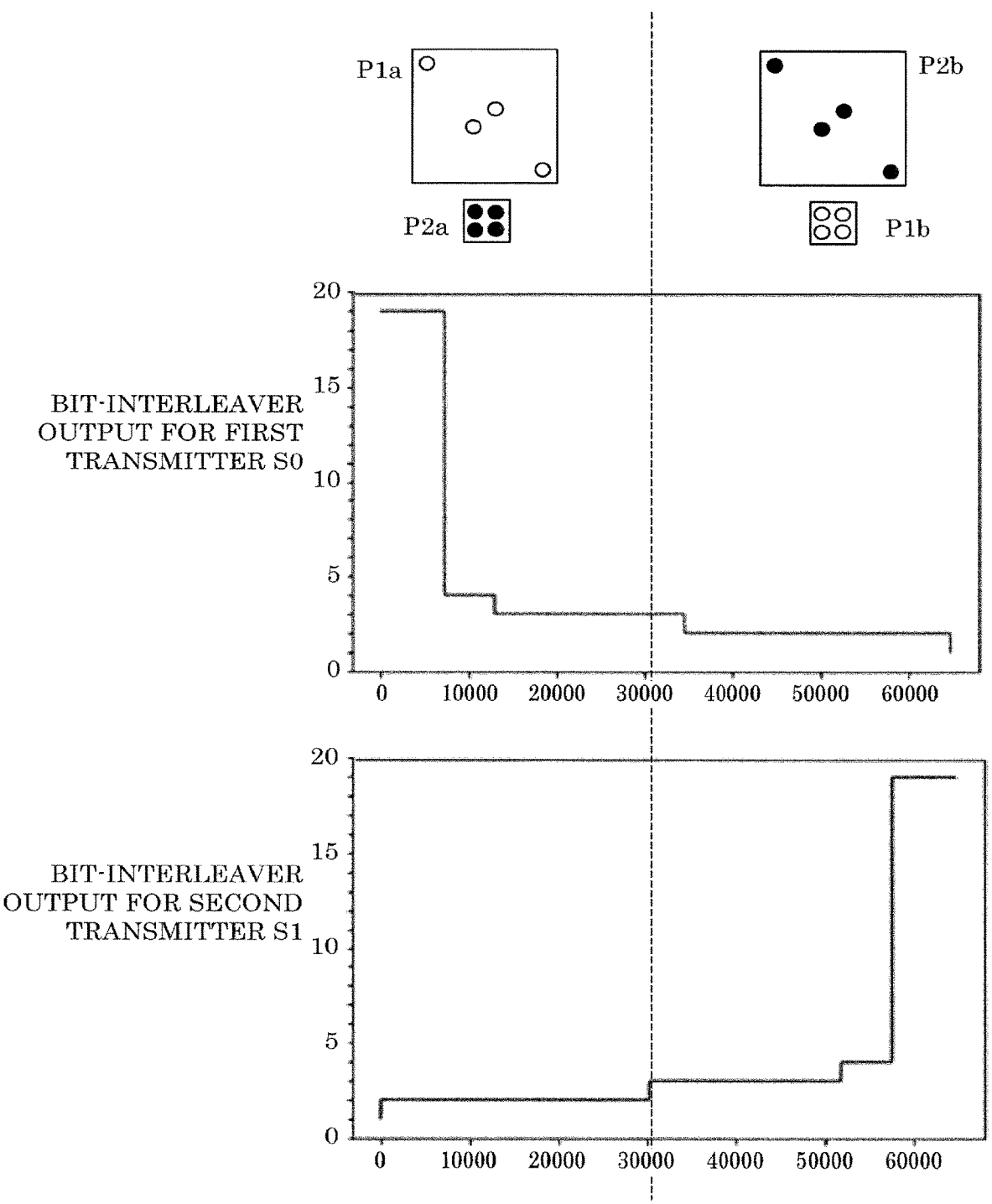
FIG. 18 illustrates matching bit-interleavers to power split QAMs according to the embodiment, the vertical solid line indicates highlights which cell types are connected to which variable nodes.

FIG. 18 illustrates the net effect. Here, the higher power cells P1$a$ are connected to the large degree variable nodes of the first LDPC code by virtue of bit-interleaver $\pi 0$. The higher power cells P2$b$ are also connected to the large degree variable nodes of the second LDPC code by virtue of bit-interleaver $\pi 1$.

Thus, when the data sequence includes a Low-Density Parity-Check (LDPC) code, the transmitter further includes a bit-interleaver that rearranges bits in the data sequence so that the fifth data (data which is assigned to a subcarrier to be transmitted with high power) to be modulated by the modulation circuit becomes a large degree node of the LDPC code having a degree larger than a predetermined degree. The modulation circuit modulates the data sequence after the rearrangement by the bit-interleaver. Please note that the large degree node having a degree larger than a predetermined degree is, for example, a node having a degree larger than half a maximum degree. For example, in FIG. 18, the large degree node is the node having the degree larger than 10.5, i.e. half a maximum degree of 19. With this, it is possible to cause the receiver to receive bits having relatively high error-correction capabilities with high probability, and improve the error correction rate of other bits. Accordingly, the error correction rate of the entire data sequence can be improved.

Figure 19:
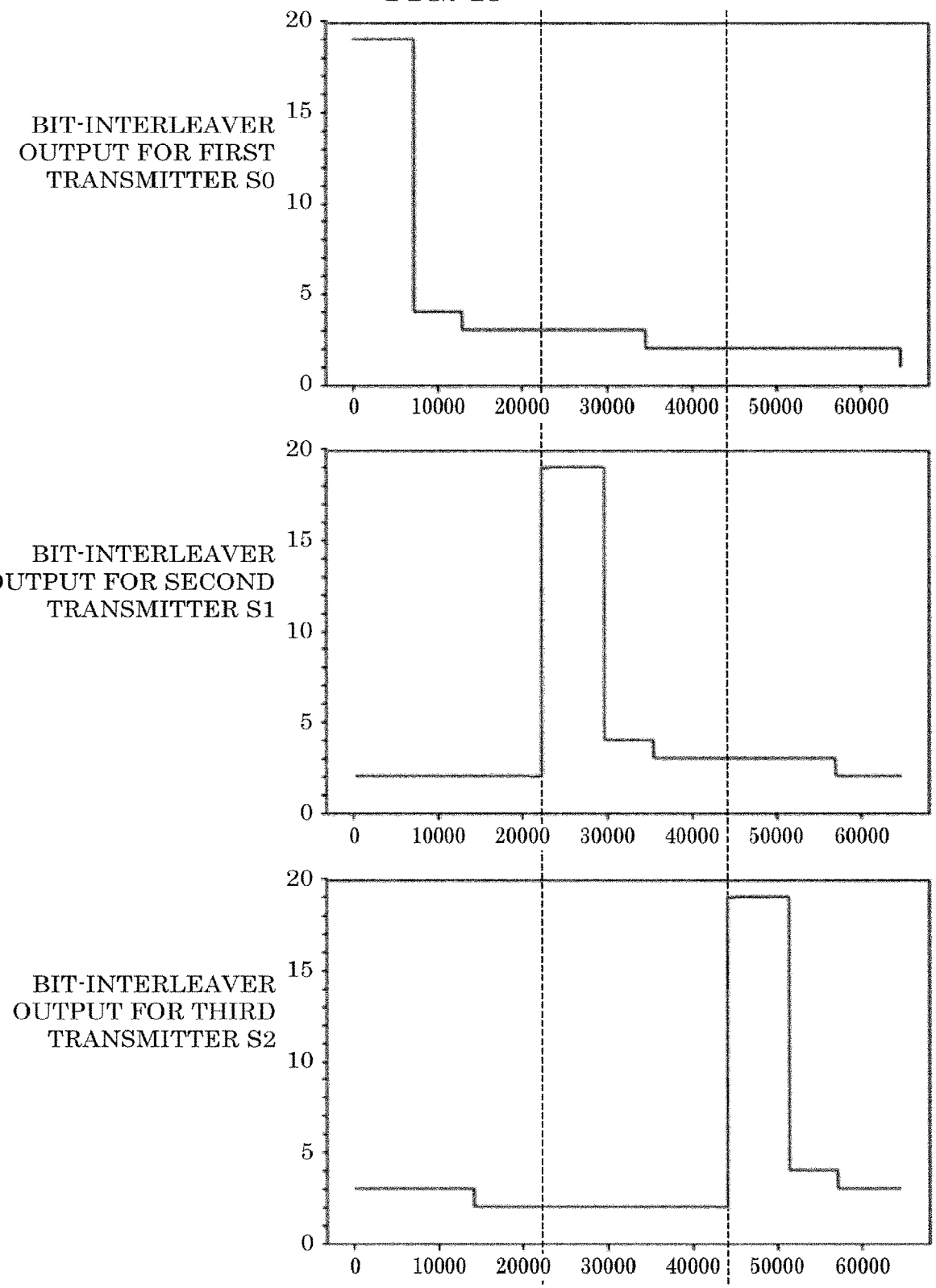
FIG. 19 illustrates bit-interleaving for three transmitters, according to the embodiment.

It is a simple matter to define bit-interleavers which move the high degree variable nodes to any desired area. Hence, for a third transmitter it is easy to define a bit-interleaver which moves the high-degree variable nodes towards the middle of the FEC-block. FIG. 19 shows the bit sequences rearranged by bit-interleavers of first transmitter S0, second transmitter S1, and third transmitter S2, for example. With this rearrangement, it is possible to assign the large degree node to a subcarrier to be transmitted with high power.

(6) Receiver

Figure 20:
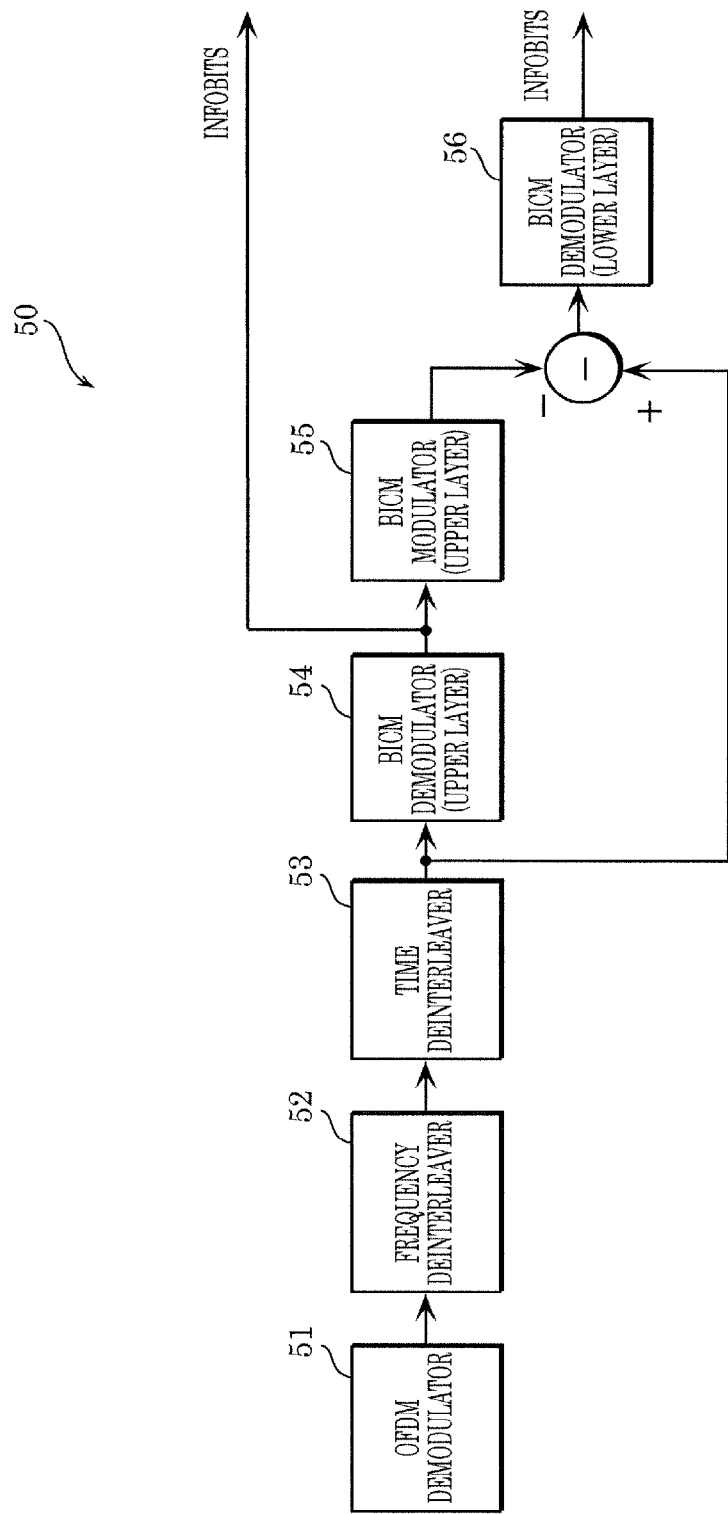
FIG. 20 illustrates a receiver according to the embodiment.

FIG. 20 illustrates receiver 50. Receiver 50 shown in FIG. 20 is a receiver that receives a signal wirelessly transmitted by transmitter 10 shown in FIG. 1.

The signal received by receiver 50 is demodulated by OFDM demodulator 51, and passes through frequency deinterleaver 52 and time deinterleaver 53. Please note that OFDM modulator 51 corresponds to a reception circuit.

Upper layer BICM demodulator 54 generates upper layer information bits by demodulating the BICM modulated signal. The process performed by BICM demodulator 54 is a demodulation process corresponding to the modulation process performed by BICM modulator 11 in transmitter 10.

Next, the generated upper layer information bits are remodulated by upper layer BICM modulator 55, and the remodulated signal is subtracted from the signal outputted from time deinterleaver 53. The resultant signal is demodulated by lower layer BICM demodulator 56 to generate lower layer information bits. Please note that the upper layer BICM demodulator and the lower layer BICM demodulator each correspond to a demodulation circuit.

Thus, the receiver includes: a reception circuit that receives a signal modulated using Quadrature Amplitude Modulation (QAM) by mapping a data sequence to only four symbols each of which differs in phase by 90 degrees from an adjacent one of the four symbols and at least two of which have different amplitudes, and wirelessly transmitted by assigning the data sequence mapped to the four symbols to different subcarriers for Orthogonal Frequency Division Multiplexing (OFDM); and a demodulation circuit that demodulates the signal received by the reception circuit, using the QAM by mapping the signal received by the reception circuit to the four symbols.

With this, the receiver can receive the signal transmitted by the transmitter using the transmission method more suitable for the real environment.

(7) Recap of the Problem Description

Superposition modulation in a broadcast context benefits from an asymmetric power distribution. This disclosure proposes the use of asymmetric QAMs to effect such a power distribution. Asymmetric QAMs are used for the high power portions of the signal in a mixture of Gray-mapped and non-Gray mapped cells. Lower power cells are transmitted as symmetric QPSK signals. Furthermore, matched bit interleaving is proposed in order to fit high degree variable nodes to high power asymmetric QAM cells, which is beneficial for the convergence iterative FEC-decoding.

(Variations)

Hereinafter, variations of the transmitter, the transmission method, the receiver, the reception method according to the above embodiment will be described.

Figure 21:
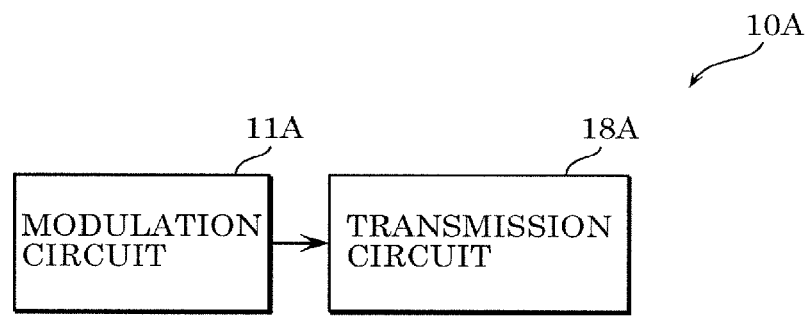
FIG. 21 is a block diagram illustrating the configuration of a transmitter according to a variation of the embodiment.

FIG. 21 is a block diagram illustrating the configuration of transmitter 10A according to a variation of the embodiment.

As shown in FIG. 21, transmitter 10A includes: modulation circuit 11A that modulates a data sequence using Quadrature Amplitude Modulation (QAM) by mapping the data sequence to only four symbols each of which differs in phase by 90 degrees from an adjacent one of the four symbols and at least two of which have different amplitudes; and transmission circuit 18A that wirelessly transmits the data sequence mapped to the four symbols through the modulation by modulation circuit 11A, by assigning the data sequence mapped to the four symbols through the modulation by modulation circuit 11A to different subcarriers for Orthogonal Frequency Division Multiplexing (OFDM).

Figure 22:
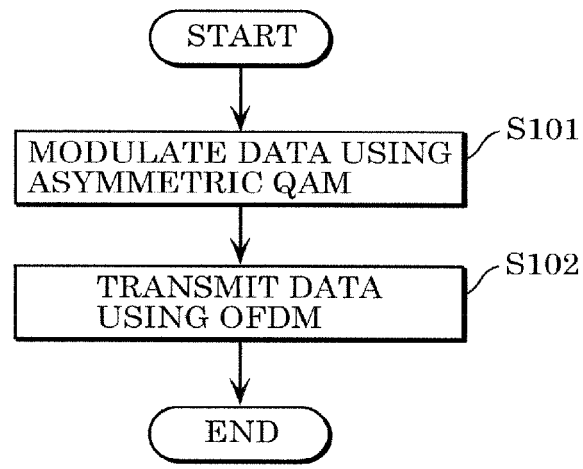
FIG. 22 is a flow chart illustrating a transmission method of the transmitter according to the variation of the embodiment.

FIG. 22 is a flow chart illustrating a transmission method of transmitter 10A according to the variation.

As shown in FIG. 22, at step S101, modulation circuit 11A modulates a data sequence using QAM by mapping the data sequence to only four symbols each of which differs in phase by 90 degrees from an adjacent one of the four symbols and at least two of which have different amplitudes.

At step S102, transmission circuit 18A wirelessly transmits the data sequence mapped to the four symbols through the modulation circuit by assigning the data sequence mapped to the four symbols through the modulation circuit to different subcarriers for OFDM.

With this, transmitter 10A can transmit a signal using the transmission method more suitable for the real environment.

Figure 23:
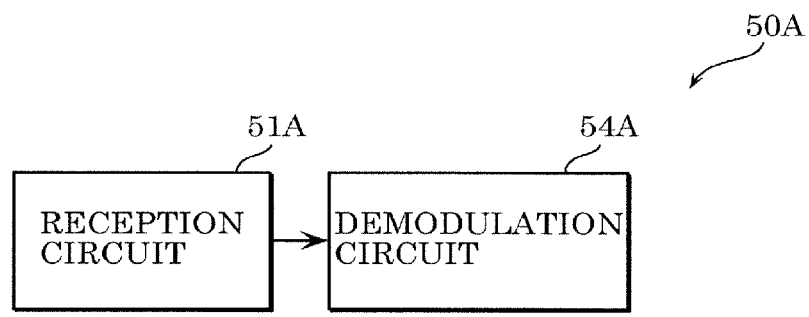
FIG. 23 is a block diagram illustrating the configuration of a receiver according to the variation of the embodiment.

FIG. 23 is a block diagram illustrating the configuration of receiver 50A according to the variation.

As shown in FIG. 23, receiver 50A includes: reception circuit 51A that receives a signal modulated using Quadrature Amplitude Modulation (QAM) by mapping a data sequence to only four symbols each of which differs in phase by 90 degrees from an adjacent one of the four symbols and at least two of which have different amplitudes, and wirelessly transmitted by assigning the data sequence mapped to the four symbols to different subcarriers for Orthogonal Frequency Division Multiplexing (OFDM); and demodulation circuit 54A that demodulates the signal received by reception circuit 51A, using the QAM by mapping the signal received by reception circuit 51A to the four symbols.

Figure 24:
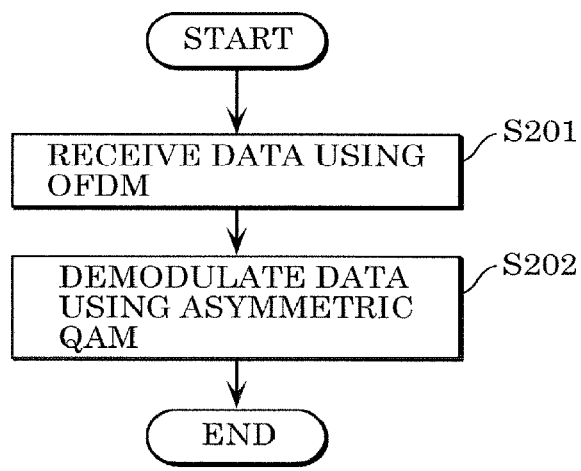
FIG. 24 is a flow chart illustrating a reception method of the receiver according to the variation of the embodiment.

FIG. 24 is a flow chart illustrating a reception method of receiver 50A according to the variation.

As shown in FIG. 24, at step S201, reception circuit 51A receives a signal modulated using QAM by mapping a data sequence to only four symbols each of which differs in phase by 90 degrees from an adjacent one of the four symbols and at least two of which have different amplitudes, and wirelessly transmitted by assigning the data sequence mapped to the four symbols to different subcarriers for OFDM.

At step S202, demodulation circuit 54A demodulates the signal received by reception circuit 51A, using the QAM by mapping the signal received by reception circuit 51A to the four symbols.

With this, receiver 50A can receive the signal transmitted by the transmitter using the transmission method more suitable for the real environment.

Each of the structural elements in the above embodiment may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory. Here, the software program for realizing the storage battery control device according to the embodiment is a program described below.

In other words, this program causes a computer to execute a transmission method including: modulating, with a modulation circuit, a data sequence using Quadrature Amplitude Modulation (QAM) by mapping the data sequence to only four symbols each of which differs in phase by 90 degrees from an adjacent one of the four symbols and at least two of which have different amplitudes; and wirelessly transmitting, with a transmission circuit, the data sequence mapped to the four symbols through the modulation circuit by assigning the data sequence mapped to the four symbols through the modulation circuit to different subcarriers for Orthogonal Frequency Division Multiplexing (OFDM).

Furthermore, this program causes a computer to execute a reception method including: receiving, with a reception circuit, a signal modulated using Quadrature Amplitude Modulation (QAM) by mapping a data sequence to only four symbols each of which differs in phase by 90 degrees from an adjacent one of the four symbols and at least two of which have different amplitudes, and wirelessly transmitted by assigning the data sequence mapped to the four symbols to different subcarriers for Orthogonal Frequency Division Multiplexing (OFDM); and demodulating, with a demodulation circuit, the signal received by the reception circuit, using the QAM by mapping the signal received by the reception circuit to the four symbols.

Although a transmitter, etc. according to one or more aspects is described based on the embodiment thus far, the present disclosure is not limited to the foregoing embodiment. In other instances, various modifications to the exemplary embodiment according to the present disclosure described above that may be conceived by a person skilled in the art and embodiments implemented in any combination of the components and functions shown in the exemplary embodiment are also included within the scope of the present disclosure, without departing from the spirit of the present disclosure.

Although only one exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure can be applied to a transmitter that wirelessly transmits a signal to a receiver. For example, the present disclosure can be applied to a transmitter that transmits a digital broadcasting signal to a television receiver serving as the receiver.

What is claimed is:

1. A transmission method comprising:
    mapping, with circuitry, a data sequence to only four symbols according to asymmetric Quadrature Amplitude Modulation (QAM), each of the four symbols having a phase that is different from a phase of an adjacent one of the four symbols by 90 degrees, at least two of the four symbols having different amplitudes; and
    generating, with circuitry, an Orthogonal Frequency Division Multiplexing (OFDM) signal based on the data sequence mapped; and
    wirelessly transmitting, with a transmitter, the OFDM signal.

2. The transmission method according to claim 1, wherein
    the transmitter has a coverage area overlapping with a coverage area of another transmitter, and
    four symbols according to asymmetric QAM of the another transmitter are provided by rotating the four symbols according to the asymmetric QAM of the transmitter by a predetermined angle.

3. The transmission method according to claim 1, wherein the four symbols include:
    a first symbol which is provided in a first quadrant and which has a first amplitude;
    a second symbol which is provided in a second quadrant and which has a second amplitude;
    a third symbol which is provided in a third quadrant and which has the first amplitude; and
    a fourth symbol which is provided in a fourth quadrant and which has the second amplitude, and
    the first amplitude is different from the second amplitude.

4. A reception method, comprising:
    wirelessly-receiving, with a receiver, an Orthogonal Frequency Division Multiplexing (OFDM) signal generated based on a mapped data sequence, the mapped data sequence being generated by mapping a data sequence to only four symbols according to asymmetric Quadrature Amplitude Modulation (QAM), each of the four symbols having a phase that is different from a phase of an adjacent one of the four symbols by 90 degrees, at least two of the four symbols having different amplitudes; and
    demodulating, with a demodulation circuit, the OFDM signal according to the asymmetric QAM to generate the data sequence.

5. The reception method according to claim 4, wherein OFDM signals wirelessly transmitted from a first transmitter and a second transmitter are received, and
    the OFDM signals are demodulated using first asymmetric QAM of the first transmitter and second asymmetric QAM of the second transmitter, four symbols according to the second asymmetric QAM being provided by rotating four symbols according to the first asymmetric QAM by a predetermined angle.

6. The reception method according to claim 4, wherein the four symbols include:
    a first symbol which is provided in a first quadrant and which has a first amplitude;
    a second symbol which is provided in a second quadrant and which has a second amplitude;
    a third symbol which is provided in a third quadrant and which has the first amplitude; and
    a fourth symbol which is provided in a fourth quadrant and which has the second amplitude, and
    the first amplitude is different from the second amplitude.

* * * * *